(12) United States Patent
Westwick et al.

(10) Patent No.: US 7,113,045 B2
(45) Date of Patent: Sep. 26, 2006

(54) POWER AMPLIFIER INPUT STRUCTURE HAVING A DIFFERENTIAL OUTPUT

(75) Inventors: Alan L. Westwick, Austin, TX (US);
Timothy J. Dupuis, Austin, TX (US);
Susanne A. Paul, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/743,219

(22) Filed: Dec. 22, 2003

(65) Prior Publication Data

US 2005/0134386 A1 Jun. 23, 2005

(51) Int. Cl.
*H03F 3/04* (2006.01)

(52) U.S. Cl. .................. 330/301; 330/135; 330/165; 330/188

(58) Field of Classification Search ................ 330/301, 330/307, 165, 135, 188
See application file for complete search history.

(56) References Cited

U.S. PATENT DOCUMENTS

| | | | |
|---|---|---|---|
| 3,684,975 A | 8/1972 | Valfre | |
| 3,903,485 A | 9/1975 | Dolby | |
| 4,024,346 A * | 5/1977 | McDermott | 381/121 |
| 4,705,967 A * | 11/1987 | Vasile | 327/581 |
| 5,220,209 A | 6/1993 | Seymour | |
| 5,723,994 A | 3/1998 | Ting et al. | |
| 5,726,603 A | 3/1998 | Chawla et al. | |
| 5,936,458 A | 8/1999 | Rylov | |
| 5,945,878 A | 8/1999 | Westwick et al. | |
| 6,118,989 A | 9/2000 | Abe et al. | |
| 6,252,455 B1 | 6/2001 | Kurby et al. | |
| 6,259,325 B1 * | 7/2001 | Ishizuka et al. | 330/301 |
| 6,448,847 B1 | 9/2002 | Paul et al. | |
| 6,462,620 B1 | 10/2002 | Dupuis et al. | |
| 6,549,071 B1 | 4/2003 | Paul et al. | |
| 6,630,861 B1 | 10/2003 | Kawaoka | |
| 6,727,754 B1 | 4/2004 | Dupuis et al. | |
| 6,756,849 B1 | 6/2004 | Dupuis et al. | |
| 6,771,122 B1 | 8/2004 | Jin et al. | |
| 6,809,581 B1 * | 10/2004 | Rofougaran et al. | 327/563 |
| 6,828,859 B1 | 12/2004 | Dupuis et al. | |
| 6,894,565 B1 | 5/2005 | Bocock et al. | |
| 6,897,730 B1 | 5/2005 | Dupuis et al. | |
| 2005/0068103 A1 | 3/2005 | Dupuis et al. | |
| 2005/0134375 A1 | 6/2005 | Westwick et al. | |
| 2005/0134376 A1 | 6/2005 | Westwick et al. | |
| 2005/0134378 A1 | 6/2005 | Westwick et al. | |

OTHER PUBLICATIONS

T. Cho, E. Dukratz, M. Mack, D. Macnally, M. Marringa, S. Mehta, C. Nilson, L. Plouvier, and S. Rabii, "A single-chip CMOS direct-conversion transceiver for 900MHz spread-spectrum digital cordless phones," IEEE International Solid-State Circuits Conference, vol. XLII, pp. 228-229, Feb. 1999.

* cited by examiner

*Primary Examiner*—Patricia Nguyen
(74) *Attorney, Agent, or Firm*—Johnson & Associates

(57) ABSTRACT

A method and apparatus provides an input structure for a power amplifier. In one example, the input structure has an input network and a predriver circuit to provide an input signal to the power amplifier. The input network includes a transformer for helping to maintain a constant input impedance. The predriver includes a limiting amplifier that provides isolation between the power amplifier and the RF input. A DC feedback circuit is used by the predriver that maintains the DC level of the inverters to a desired level.

21 Claims, 5 Drawing Sheets

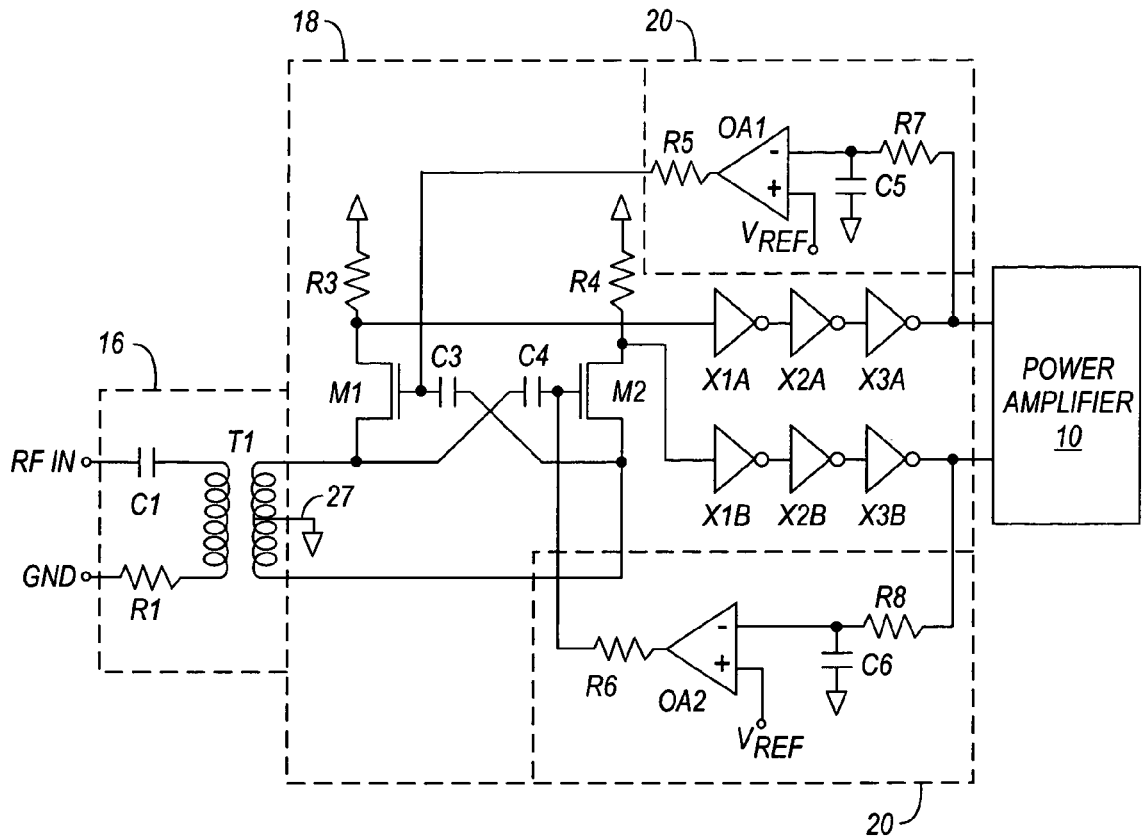
FIG. 9
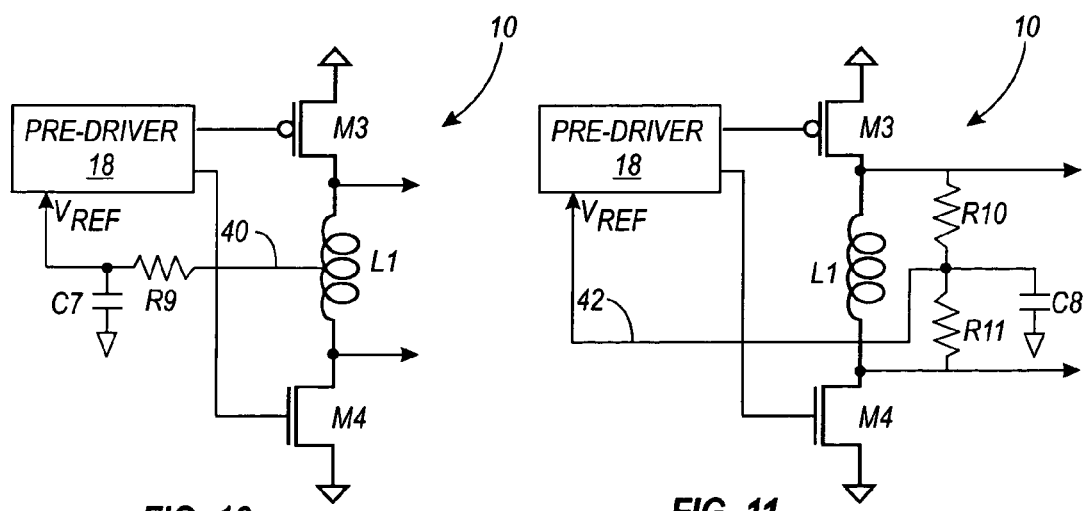
FIG. 10  FIG. 11

POWER AMPLIFIER INPUT STRUCTURE HAVING A DIFFERENTIAL OUTPUT

FIELD OF THE INVENTION

This invention relates to power amplifiers. In particular, this invention relates to techniques for providing input matching networks and predrivers for power amplifiers.

BACKGROUND OF THE INVENTION

In some applications of power amplifiers, various problems are encountered. For example, for a power amplifier implemented on a semiconductor chip, the ground level on the chip may be different from the ground level found in another device or on a circuit board. In some applications, it is desired to provide differential signals to drive a power amplifier, which are substantially constant and independent of the input power level.

In prior art RF power amplifiers, another common problem is that the input impedance, as seen at the RF input terminal, changes as the output power of the power amplifier varies. This problem is reflected in the voltage standing wave ratio (VSWR) specification. In the example of a cellular telephone environment, the goal may be to provide a 50 ohm impedance to the transmit VCO, with a VSWR ratio as low as possible (e.g., less than 2:1) over certain operating parameters. This problem of a varying input impedance can cause difficulties with the transmit VCO driving the power amplifier, such as a variation in the output frequency of the VCO. Also, this problem causes difficulties with the ability to use different transmit VCO modules with a power amplifier.

SUMMARY OF THE INVENTION

A circuit of the invention is provided for transforming a singled-ended signal to a differential signal for use by an RF power amplifier suitable for transmitting signals in an RF communication system. The circuit includes a silicon semiconductor device; an RF power amplifier formed on the semiconductor device; a transformer formed on the semiconductor device, the transformer having a primary side with first and second terminals, and a secondary side with first and second terminals coupled to the RF power amplifier; and wherein an RF input signal is coupled to the first terminal of the primary side of the transformer, and wherein a reference node is coupled to the second terminal of the primary side of the transformer, producing a differential RF signal at the first and second terminals of the secondary side of the transformer.

Another embodiment of the invention provides a method of transforming a singled-ended RF signal to a differential RF signal in an RF power amplifier. The method includes providing a silicon semiconductor device; forming an RF power amplifier on the semiconductor device; forming a transformer on the semiconductor device, the transformer having a primary side with first and second nodes, and a secondary side with first and second nodes; and coupling a single ended RF input signal to the first node on the primary side of the transformer and coupling an RF ground signal to the second node on the primary side of the transformer to generate a differential RF signal at the first and second nodes on the secondary side of the transformer.

Another embodiment of the invention provides an RF power amplifier suitable for transmitting signals in an RF communication system. The RF power amplifier includes a silicon semiconductor device; a power amplifier formed on the semiconductor device, the power amplifier having an input and an output; and a preamplifier stage coupled to the input of the power amplifier, wherein the preamplifier stage further comprises a transformer coupled between the input of the power amplifier and an RF input node, and wherein the preamplifier stage is formed on the semiconductor device.

Another embodiment of the invention provides a method of converting an RF input signal from a first ground potential to a second ground potential for use with an RF power amplifier. The method includes providing a silicon semiconductor device; forming an RF power amplifier on the semiconductor device; providing a first input node; providing a second input node; forming a transformer on the semiconductor device, the transformer having a primary side and a secondary side, wherein a first terminal of the primary side of the transformer is coupled to the first input node, and wherein a second terminal of the primary side of the transformer is coupled to the second input node; and coupling the first input node to an RF signal and the second input node to a first ground potential to generate an RF signal at a first terminal of the secondary side of the transformer and a second ground potential at a second terminal of the secondary side of the transformer.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 9 is a schematic diagram of one example of a power amplifier, input network, predriver circuit, and feedback circuit.

FIGS. 10 and 11 show two examples of techniques of sensing the DC level at the output of a power amplifier.

DETAILED DESCRIPTION

In order to provide a context for understanding this description, the following description illustrates one example of a typical application of the present invention. A power amplifier using the input structure of the present invention may be used with a wireless transmission system such as a cellular or mobile telephone or other device. In a wireless device such as a cellular telephone, the wireless device may include a transceiver, an antenna duplexer, and an antenna. Connected between the transceiver and the antenna duplexer is an RF power amplifier for amplifying signals for transmission via the antenna. In the case of a wireless telephone application, the invention may be applied to GSM, CDMA, PCS, DCS, etc., or any other wireless systems. This is just one example of an application of a power amplifier utilizing the present invention. The invention may also be used in any other application requiring a power amplifier.

Generally, the present invention provides an input structure for a power amplifier that minimizes the problems in the prior art discussed above. In one example, the invention uses an input network and a predriver circuit to provide an input signal to the power amplifier. The input network includes a transformer for helping to maintain a constant input impedance and to provide isolation between the board and chip ground levels. The predriver includes a limiting amplifier that provides isolation between the power amplifier and the RF input. A DC feedback circuit is used by the predriver that maintains the DC level of the inverters to a desired level.

Figure 1:
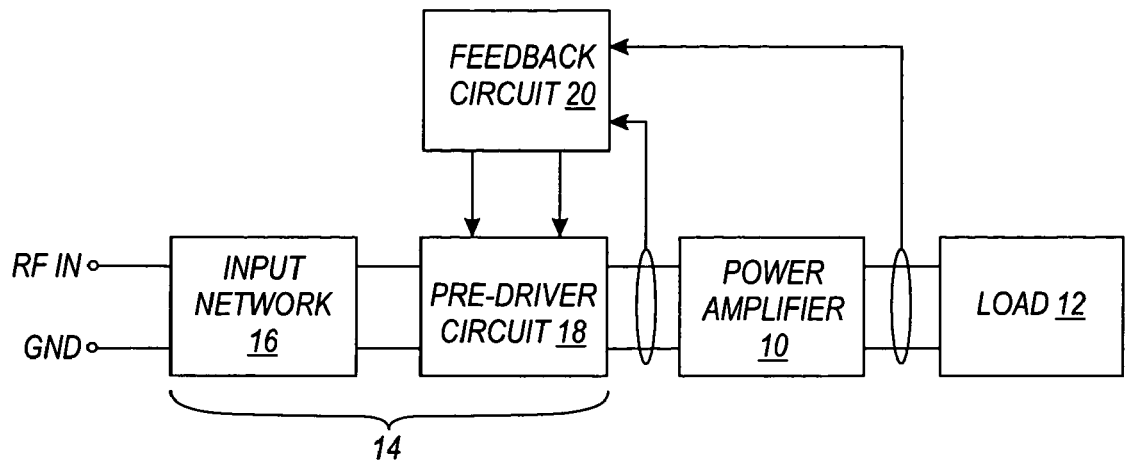
FIG. 1 is a block diagram of one example of a power amplifier and input structure of the present invention.

FIG. 1 is a block diagram of one example of a power amplifier and input structure of the present invention. A power amplifier 10 is shown connected to a load 12, which may include an antenna in a wireless application. The power amplifier 10 may be a single or multiple stage power amplifier, depending on the application. An input circuit 14 is connected to the input of the power amplifier 10 as shown. The input circuit 14 includes an input network 16, a predriver circuit 18, and a feedback circuit 20. Details of the input network 16, the predriver circuit 18, and the feedback circuit 20 are described in detail below.

The input network 16 has two inputs coupled to an RF input signal (RF IN) and to RF ground (RF GND). The RF input signal and RF ground may be provided by a transceiver or other device (not shown). The input network 16 also has two outputs, which are connected to inputs of the predriver circuit 18. The predriver circuit 18 has two outputs, which are connected to the inputs of the first stage of the power amplifier 10. The feedback circuit 20 provides one or more feedback signals to the predriver circuit 18. In the example shown in FIG. 1, connections for a differential amplifier and predriver are shown. A singled ended approach may also be used with the present invention (e.g., see FIG. 2). The feedback circuit 20 provides the feedback signals based on inputs from the input and/or output of the power amplifier 10 (described in detail below).

Figure 2:
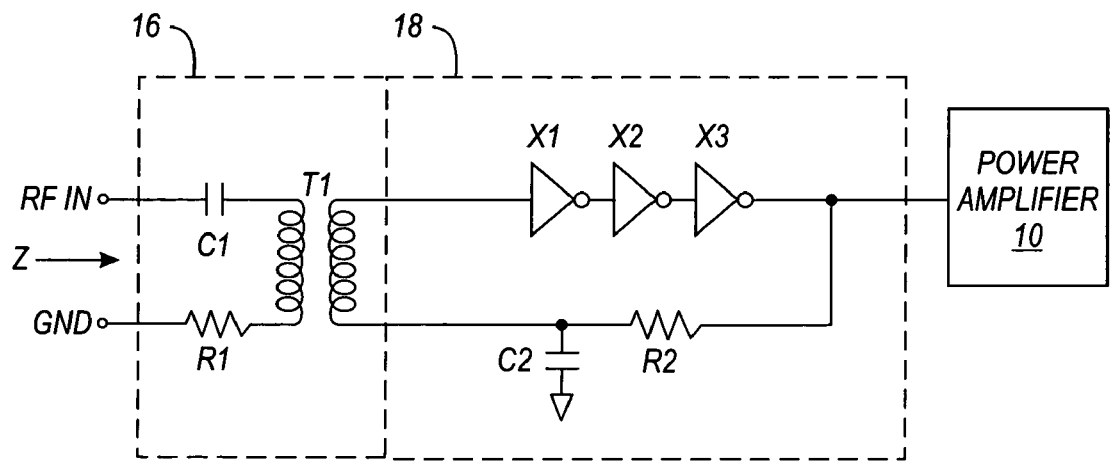
FIG. 2 shows one example of an implementation of the input network, predriver circuit, and feedback circuit shown in FIG. 1.

In the example shown in FIG. 1, the input impedance and output amplitude of the predriver circuit 18 can be fixed and do not depend on the power delivered to the load 12. FIG. 2 shows one example of an implementation of the input network 16, predriver circuit 18, and feedback circuit 20 shown in FIG. 1. FIG. 2 shows an input network 16 having a transformer T1. The primary side of transformer T1 has a first terminal that is coupled to the RF input signal via capacitor C1. A second terminal is coupled to ground via resistor R1. The transformer T1, capacitor C1 and resistor R1 are designed to provide a desired impedance match (e.g., 50 ohms) to the RF input signal at the carrier frequency. Since the transformer loading is not a function of the power amplifier gain, this match will remain close to the desired impedance. Any variations in the impedance seen looking into the main power amplifier 10 are not seen when looking into the RF input (illustrated by arrow Z in FIG. 2). The transformer T1 also provides electrostatic discharge (ESD) protection. The transformer coupling also rejects the common-mode portion of an input voltage, where an on-chip ground has a large signal referenced to circuit board ground. If the circuit shown in FIG. 2 is implemented using CMOS technology, all of the components shown can be built on the CMOS die, including the transformer and capacitors. Other types of technology (in addition to CMOS technology) may also be used.

The secondary side of transformer T1 is connected to the predriver circuit 18. The predriver circuit 18 has a plurality of inverters X1, X2, and X3 connected in series forming an inverter string. The inverters may be implemented using CMOS technology, or using any other desired technology. The inverter string acts as a limiting amplifier that provides isolation between the power amplifier 10 and the 50 ohm RF input. Amplitude variations of the input signal are taken out by the limiting action of the limiting amplifier. This limiting function can simplify the interfacing of a power amplifier to different drive sources, which may have different drive levels. The feedback circuit 20 shown in FIG. 1 is provided by a capacitor C2 and a resistor R2, which is coupled between the output of the last inverter and a terminal of the secondary winding of the transformer T1. The feedback circuit maintains the DC level of the inverters near midsupply, which maximizes the gain of the inverters and results in a square wave at the output of inverter X3 that has a duty cycle near 50%. In this example, the feedback circuit is a negative feedback loop. The output of the inverter string is coupled to the input of the power amplifier (not shown).

Figure 3:
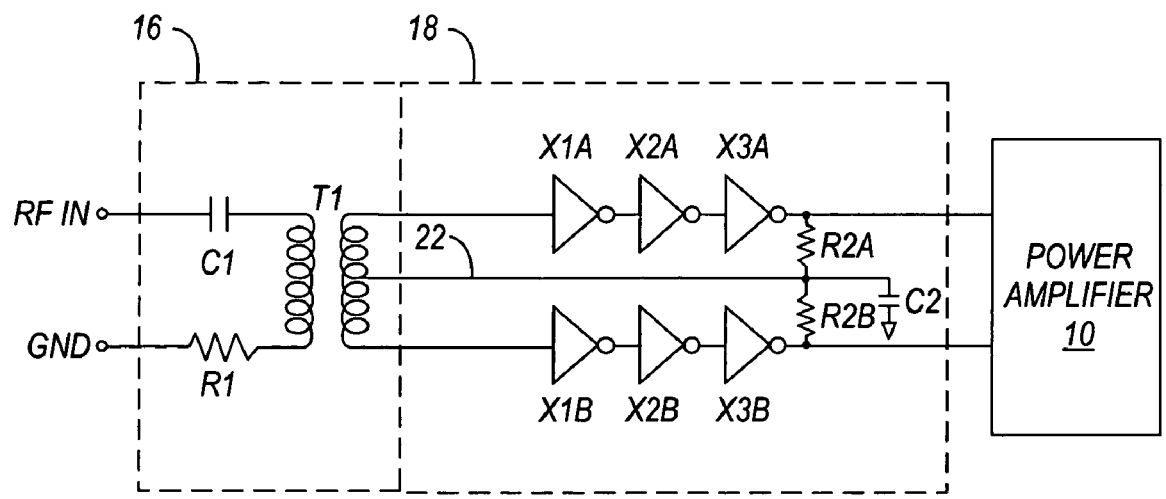
FIG. 3 is one example of a differential implementation the circuit shown in FIG. 1.

Some power amplifier architectures use a balanced (differential) predriver output. FIG. 3 is one example of a differential implementation the circuit shown in FIG. 1. The circuit shown in FIG. 3 is similar to the circuit shown in FIG. 2, but provides a differential output to the power amplifier. Like FIG. 2, the input network 16 shown in FIG. 3 has a transformer T1 with capacitor C1 and resistor R1 coupled to the primary side. The predriver circuit 18 has two inverter strings, each coupled to one of the terminals of the transformer T1. A first inverter string is formed by inverters X1A, X2A, and X3A. A second inverter string is formed by inverters X1B, X2B, and X3B. The outputs of inverters X3A and X3B provide a differential input signal to the main power amplifier. The transformer T1 has a center-tapped secondary winding 22 that is coupled to a voltage divider formed by resistors R2A and R2B and capacitor C2. The voltage divider and center tap provide the DC feedback circuit, which essentially provides the average DC level at the outputs of the inverter strings to the center tap.

In some applications, the signals levels at the inputs of inverters X1A and X1B may be lower than desired. If inverters X1A and X1B are the same size as inverter X1 of FIG. 2, and if the capacitor, resistors, transformer, and RF input signal level are all the same as in FIG. 2, then the AC signal amplitude at the inverter inputs will be half as large for the differential circuit (FIG. 3) than for the singled ended circuit (FIG. 2). These lower signal amplitudes have several potential disadvantages, including higher power consumption, higher noise, and instability of the DC feedback circuit. If the inverters are CMOS inverters, the inverters will work best when the input signal is large enough to switch off the PMOS device on positive peaks and the NMOS device on negative peaks. Therefore, it may be advantageous to boost the signal at the inverter inputs. FIG. 3 also illustrates a technique for transforming a single-ended RF signal (referenced to a circuit board ground) to a differential signal (referenced to the IC ground) using the transformer T1.

Figure 4:
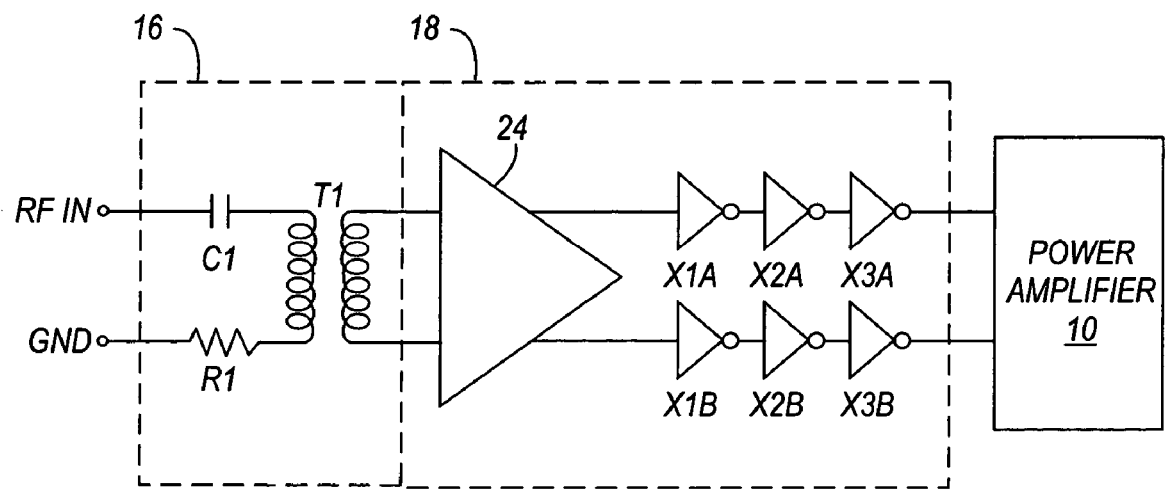
FIG. 4 is a schematic diagram of an input network and predriver that includes a differential amplifier to boost the signals provided to the inverter strings.
Figure 5:
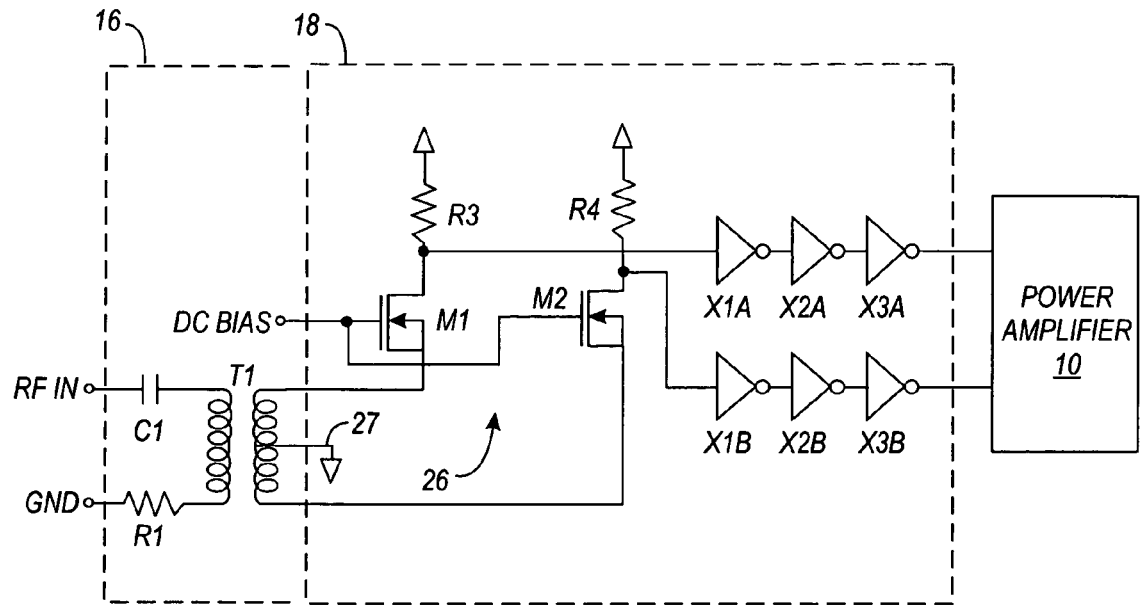
FIG. 5 is a schematic diagram of an input network and predriver circuit having a common-gate differential amplifier.
Figure 6:
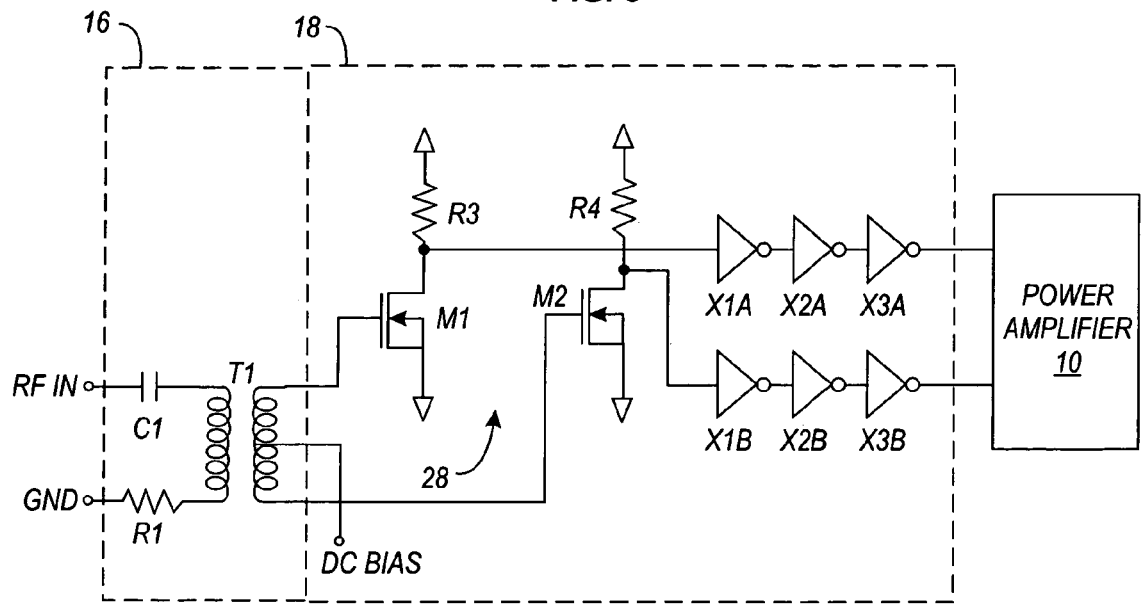
FIG. 6 is a schematic diagram of an input network and predriver circuit having a common-source differential amplifier.

FIG. 4 is a schematic diagram of an input network and predriver that boosts the signals provided to the inverter strings. FIG. 4 shows an input network 16 similar to the input networks described above. FIG. 4 also shows a predriver circuit 18 having a differential amplifier 24 that amplifies the differential signals that are provided to the inverter strings. A DC feedback circuit, similar to those described above, is not shown in FIG. 4. FIGS. 5 and 6 show two examples of the differential amplifier 24 shown in FIG. 4.

FIG. 5 shows a common-gate differential amplifier 26 coupled between the transformer T1 and the inverter strings. The common-gate amplifier 26 is formed by two switching devices M1 and M2 and two resistors R3 and R4. The source of each switching device is connected to one of the terminals of the transformer T1. The drain of each of the switching devices is connected to the input of one of the inverter strings, and to a voltage source, via resistors R3 and R4. A bias signal (DC BIAS) is provided to the gates of both switching devices. The bias signal may be provided by the DC feedback circuit (not shown), if desired. A current path from the switching devices M1 and M2 to ground (or alternately, some other voltage reference node) is provided by a center tap 27 formed in the secondary side of the transformer T1. A current path could also be formed in other ways. For example, one or more inductors could be coupled between the sources of switching devices M1 and M2 and ground.

FIG. 6 shows a common-source differential amplifier 28 coupled between the transformer T1 and the inverter strings. The common-source amplifier 28 is formed by two switching devices M1 and M2 and two resistors R3 and R4. The source of each switching device is connected to ground. The gate of each switching device is connected to one of the terminals of the transformer T1. The drain of each of the switching device is connected to the input of one of the inverter strings, and to a voltage source via resistors R3 and R4. A bias signal (DC BIAS) is provided to a center tap formed in the secondary side of the transformer T1. One difference between the circuits shown in FIGS. 5 and 6 is that the common-gate amplifier 26 (FIG. 5) provides a lower input impedance than the common-source amplifier 28 (FIG. 6).

Figure 7:
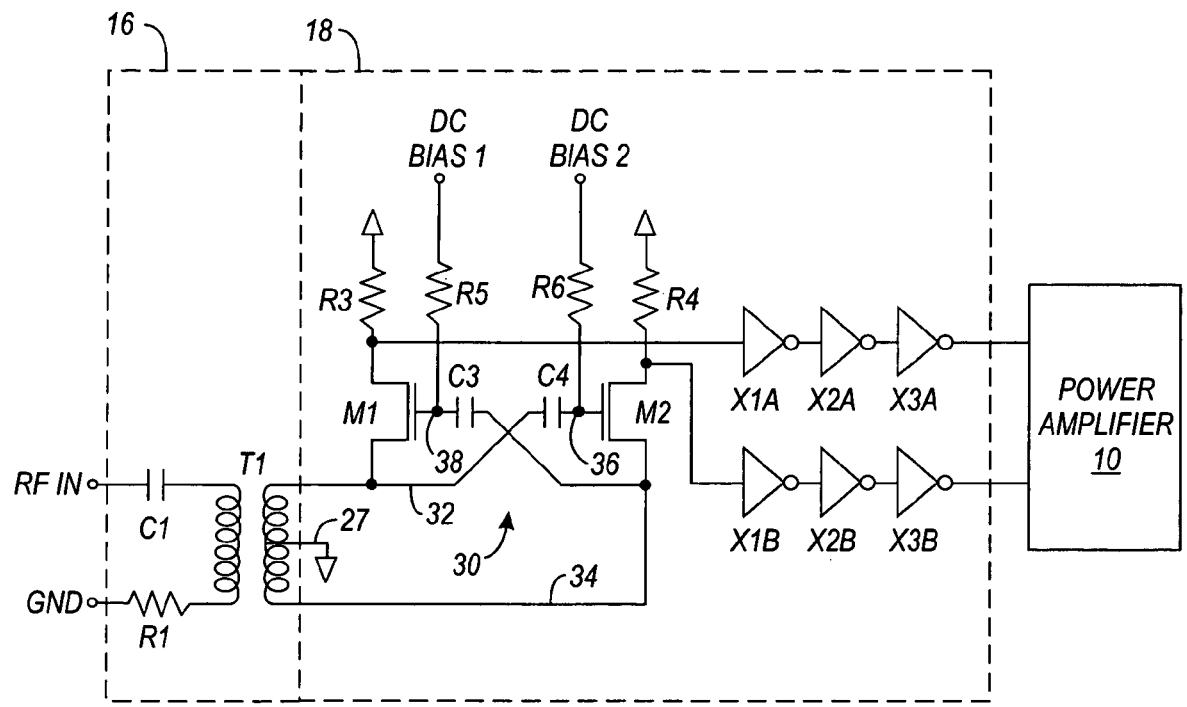
FIG. 7 is a schematic diagram of an input network and predriver circuit with another example of an differential amplifier.

In addition to the examples shown in FIGS. 5 and 6 individually, another approach is to combine these examples. FIG. 7 is a schematic diagram of an input network 16 and predriver circuit 18 having a differential amplifier 30. The amplifier 30 can be thought of as a common-gate amplifier stage having dynamic gate biasing. The amplifier 30 may be similar to the amplifier 26 shown in FIG. 5, with a first capacitor C3 coupled between the gate of switching device M1 and the source of switching device M2. A second capacitor C4 is coupled between the gate of switching device M2 and the source of switching device M1.

The arrangement of capacitors C3 and C4 and switching devices M1 and M2 enable the RF input signal to be coupled to both the gates and sources of switching devices M1 and M2. A first DC bias (DC Bias 1) is coupled to the gate of switching device M1 via resistor R5. A second DC bias (DC Bias 2) is coupled to the gate of switching device M2 via resistor R6. The capacitors C3 and C4 couple the differential RF signal to the gates of switching devices M1 and M2. The voltage at the gates of the switching devices will have a DC level affected by the DC bias, and an AC level affected by the RF input signal (via capacitor C3 or C4). Typically, capacitors C3 and C4 should be large compared to the gate capacitance of the switching devices M1 and M2. Also, the impedance of the capacitors C3 and C4, at the RF operating frequency, should be small compared to the impedance of the biasing resistors R5 and R6. By adding capacitors C3 and C4, the gain of the amplifier 30 is increased.

Figure 8:
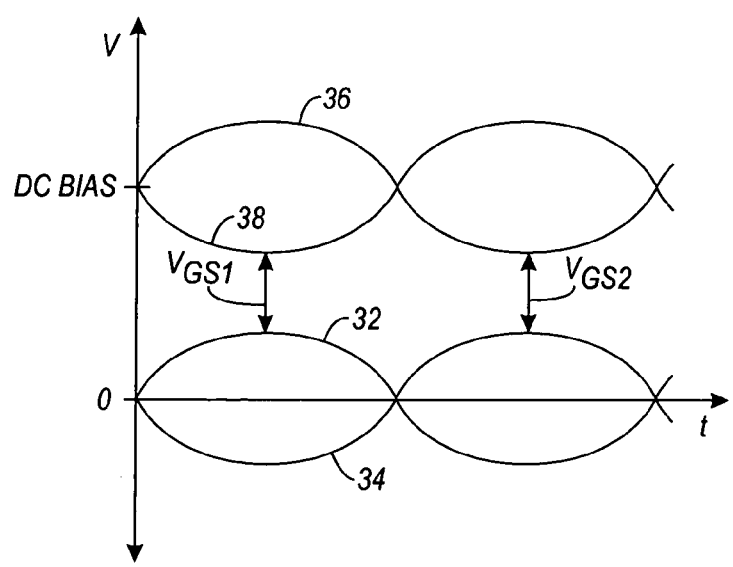
FIG. 8 is a plot of the voltage at four nodes in the amplifier shown in FIG. 7.

FIG. 8 is a plot of the voltage at four nodes (nodes 32, 34, 36, and 38) in the amplifier 30 shown in FIG. 7. To illustrate the operation of the circuit shown in FIG. 7, consider the signals at the gate and source (nodes 38 and 32 respectively) of switching device M1. During the first half cycle of the input signal, the gate of switching device M1 (node 38) falls while the source of switching device M1 (node 32) rises in voltage, thus reducing the gate-source voltage ($V_{GS1}$) of switching device M1 and causing the drain current of switching device M1 to decrease. During the second half cycle of the input signal, the gate of switching device M1 (node 38) rises while the source of switching device M1 (node 32) falls, thus increasing $V_{GS1}$ and causing the drain current of switching device M1 to increase.

The switching device M2 operates in a similar manner, as illustrated in FIG. 8. During the first half cycle of the input signal, the gate of switching device M2 (node 36) rises while the source of switching device M2 (node 34) falls in voltage, thus raising the gate-source voltage ($V_{GS2}$) of switching device M2 and causing the drain current of switching device M2 to increase. During the second half cycle of the input signal, the gate of switching device M2 (node 36) decreases while the source of switching device M2 (node 34) rises, thus decreasing $V_{GS2}$ and causing the drain current to decrease. By coupling both the gate and source of switching devices, the gain is increased relative to the common-source (FIG. 6) or common-gate (FIG. 5) amplifier configurations.

There are numerous ways to generate the DC bias signals for the gates of switching devices M1 and M2 in FIG. 7, as persons of ordinary skill in the art would understand. One approach of generating the DC bias signals is to use a feedback circuit that forces the DC output voltage of the predriver circuit 18 to be equal to a reference voltage, such as mid-supply. FIG. 9 is a schematic diagram of a power amplifier 10, input network 16, predriver circuit 18, and feedback circuit 20. The circuit shown in FIG. 9 is similar to the circuit of FIG. 7, showing an example of how the DC bias signals can be generated. The DC feedback circuit 20 has two op-amps OA1 and OA2 with outputs coupled to the resistors R5 and R6. One input of each op-amp is coupled to a reference voltage $V_{REF}$, which may be a fixed reference voltage, or may be the DC output voltage of the power amplifier 10 (described below). The other input of each op-amp is coupled to the output of the inverter string via resistors R7 and R8 and capacitors C5 and C6. In the circuit shown in FIG. 9, the predriver circuit 18 supplies drive signals to the first stage of the power amplifier 10. If the DC level at the output of the power amplifier 10 is used as a reference level ($V_{REF}$), then the DC feedback network shown above will adjust the DC bias level at the gates of switching devices M1 and M2 so that the DC levels at the input and output of the power amplifier 10 are approximately identical (e.g., near mid-supply). This condition will produce the largest and most balanced RF signal levels at the output of the power amplifier 10. Note that in the implementation shown in FIG. 9, the power amplifier 10 is an inverting amplifier so that its output voltage is used as the reference voltage $V_{REF}$ in order to have negative feedback.

There are numerous ways of sensing the DC level at the output of the power amplifier 10. The approach used to sense the DC level at the output of the power amplifier 10 will depend on various factors, including the type of power amplifier used. FIGS. 10 and 11 show two examples of techniques of sensing the DC level at the output of a power amplifier. In these examples, a power amplifier having two switching devices (M3 and M4) and an inductor L1 connected in series between two power supply nodes is used. This type of power amplifier is described in detail in commonly-owned U.S. Pat. No. 6,549,071, issued on Apr. 15, 2003, entitled "POWER AMPLIFIER CIRCUITRY AND METHOD USING AN INDUCTANCE COUPLED TO POWER AMPLIFIER SWITCHING DEVICES," which is expressly incorporated by reference herein. In FIG. 10, a center tap 40 is formed in the inductor L. The reference signal $V_{REF}$ is provided by the center tap 40 and resistor R9 and capacitor C7. In FIG. 11, a voltage divider is formed by resistors R10 and R11 and capacitor C8 at the output of the power amplifier 10. The center node of the voltage divider provides the reference signal $V_{REF}$.

The input structure of the present invention can be used with any desired power amplifier, in addition to the examples provided above. The invention may also be packaged in any desired manner. For example, the input structure can reside on an integrated circuit (IC) that also contains the power amplifier. In this example, all of the components of the input structure may reside on the IC. In one example, the components in the IC are CMOS components. In IC can be fabricated with any suitable substrate using any available fabrication technology.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A circuit for transforming a singled-ended signal to a differential signal for use by an RF power amplifier suitable for transmitting signals in an RF communication system comprising:
   a silicon semiconductor device;
   an RF power amplifier formed on the semiconductor device;
   a transformer formed on the semiconductor device, the transformer having a primary side with first and second terminals, and a secondary side with first and second terminals coupled to the RF power amplifier;
   a pre-driver circuit coupled between the transformer and the power amplifier; and
   wherein an RF input signal is coupled to the first terminal of the primary side of the transformer,
      and wherein a ground node is coupled to the second terminal of the primary side of the transformer, producing a differential RF signal at the first and second terminals of the secondary side of the transformer.

2. The circuit of claim 1, wherein the silicon semiconductor device is a complimentary metal-oxide semiconductor (CMOS) device.

3. The circuit of claim 1, wherein the RF communication system is a cellular telephone system.

4. The circuit of claim 1, wherein the pre-driver circuit further comprises a limiting amplifier.

5. The circuit of claim 4, wherein the limiting amplifier includes a string of inverters.

6. The circuit of claim 4, wherein the limiting amplifier includes an amplifier coupled between the limiting amplifier and the transformer.

7. A method of transforming a singled-ended RF signal to a differential RF signal in an RF power amplifier comprising the steps of:
   providing a silicon semiconductor device;
   forming an RF power amplifier on the semiconductor device;
   forming a transformer on the semiconductor device, the transformer having a primary side with first and second nodes, and a secondary side with first and second nodes;
   coupling a single ended RF input signal to the first node on the primary side of the transformer and coupling an RF ground signal to the second node on the primary side of the transformer to generate a differential RF signal at the first and second nodes on the secondary side of the transformer;
   coupling the first and second nodes of the secondary side of the transformer to the RF power amplifier; and
   coupling a predriver circuit between the transformer and the RF power amplifier.

8. The method of claim 7, wherein the silicon semiconductor device is a CMOS device.

9. The method of claim 7, wherein the RF power amplifier is suitable for use in an RF communication system.

10. The method of claim 9, wherein the RF communication system is a cellular telephone system.

11. An RF power amplifier suitable for transmitting signals in an RF communication system comprising:
    a silicon semiconductor device;
    a power amplifier formed on the semiconductor device, the power amplifier having an input and an output; and
    a preamplifier stage coupled to the input of the power amplifier, wherein the preamplifier stage further comprises a transformer coupled between the input of the power amplifier and an RF input node, wherein the preamplifier stage further comprises a limiting amplifier coupled to the transformer, wherein the limiting amplifier further comprises a plurality of series coupled inverters, and wherein the preamplifier stage is formed on the semiconductor device.

12. The RF power amplifier of claim 11, wherein the preamplifier further comprises a DC feedback loop.

13. The RF power amplifier of claim 11, wherein the power amplifier is comprised of a plurality of amplifying stages.

14. The RF power amplifier of claim 11, wherein the RF communication system is a cellular telephone system.

15. The RF power amplifier of claim 11, wherein the silicon semiconductor device is a CMOS device.

16. A method of converting an RF input signal from a first ground potential to a second ground potential for use with an RF power amplifier comprising the steps of:
    providing a silicon semiconductor device;
    forming an RF power amplifier on the semiconductor device;
    providing a first input node;
    providing a second input node;
    forming a transformer on the semiconductor device, the transformer having a primary side and a secondary side, wherein a first terminal of the primary side of the transformer is coupled to the first input node, and wherein a second terminal of the primary side of the transformer is coupled to the second input node;

coupling the first input node to an RF signal and the second input node to a first ground potential to generate an RF signal at a first terminal of the secondary side of the transformer and a second ground potential at a second terminal of the secondary side of the transformer; and coupling the first and second terminals of the secondary side of the transformer to the RF power amplifier.

17. The method of claim 16, wherein the silicon semiconductor device is a CMOS device.

18. The method of claim 16, wherein the RF power amplifier is suitable for use in an RF communication system.

19. The method of claim 18, wherein the RF communication system is a cellular telephone system.

20. The method of claim 7, wherein the predriver circuit includes a limiting amplifier coupled between the transformer and the RF power amplifier.

21. The method of claim 7, wherein the predriver circuit includes a first limiting amplifier coupled between the first node of the secondary side of the transformer and a first RF power amplifier input, and a second limiting amplifier coupled between the second node of the secondary side of the transformer and a second RF power amplifier input.

* * * * *